(12) United States Patent
Stoner et al.

(10) Patent No.: US 9,986,655 B1
(45) Date of Patent: May 29, 2018

(54) CONVERGED INFRASTRUCTURE STRAP

(71) Applicant: VCE Company, LLC, Richardson, TX (US)

(72) Inventors: Thaddeus Stoner, Richardson, TX (US); Donald Norbeck, Richardson, TX (US)

(73) Assignee: VCE IP Holding Company LLC, Richardson, TX (US)

( * ) Notice: Subject to any disclaimer, the term of this patent is extended or adjusted under 35 U.S.C. 154(b) by 321 days.

(21) Appl. No.: 14/079,561

(22) Filed: Nov. 13, 2013

(51) Int. Cl.
*H05K 7/02* (2006.01)
*H05K 7/14* (2006.01)

(52) U.S. Cl.
CPC ............ *H05K 7/023* (2013.01); *H05K 7/02* (2013.01); *H05K 7/14* (2013.01); *H05K 7/1485* (2013.01)

(58) Field of Classification Search
CPC .................................. H05K 7/02; H05K 7/023
USPC .................................. 257/685–686; 294/147
See application file for complete search history.

(56) References Cited

U.S. PATENT DOCUMENTS

| | | | | |
|---|---|---|---|---|
| 5,148,002 A * | 9/1992 | Kuo | ........................ | H01Q 1/273 219/211 |
| 5,393,025 A * | 2/1995 | Franklin | ................. | A47B 81/06 248/317 |
| 5,416,730 A * | 5/1995 | Lookofsky | .............. | G06F 1/163 361/679.02 |
| 5,491,651 A * | 2/1996 | Janik | ........................ | G06F 1/163 361/679.03 |
| 5,572,401 A * | 11/1996 | Carroll | .................... | G06F 1/163 361/679.03 |
| 5,701,067 A * | 12/1997 | Kaji | ........................ | A45C 15/00 136/293 |
| 5,774,338 A * | 6/1998 | Wessling, III | .......... | G06F 1/163 2/94 |
| 5,842,535 A * | 12/1998 | Dennis | ................... | B62M 13/00 180/206.8 |
| 5,900,850 A * | 5/1999 | Bailey | ....................... | G09F 9/33 340/815.83 |
| 6,105,511 A * | 8/2000 | Bridges | ................ | H05K 7/1488 108/55.1 |
| 6,179,121 B1 * | 1/2001 | Ferguson | ............ | G11B 33/0411 206/308.1 |
| 6,262,889 B1 * | 7/2001 | Newman | ................ | G06F 1/163 361/679.54 |
| 6,567,277 B1 * | 5/2003 | Doherty | ............. | B65H 75/4473 361/752 |
| 7,146,258 B2 * | 12/2006 | Pincu | ...................... | G06F 1/263 700/286 |
| 7,307,851 B2 * | 12/2007 | Dimarco | ............. | H05K 7/1425 361/752 |

(Continued)

*Primary Examiner* — Robert J Hoffberg
*Assistant Examiner* — Matt Dhillon
(74) *Attorney, Agent, or Firm* — Womble Bond Dickinson (US) LLP

(57) ABSTRACT

An equipment strap is provided. The equipment strap includes at least one strap, the at least one strap configured to hold together a plurality of electronic devices as a bundle of the electronic devices. The equipment strap includes at least one panel attached to the at least one strap. The at least one panel includes at least one cable integrated therein. The at least one cable is configured to couple to the plurality of electronic devices, wherein the at least one cable provides an electrical interconnection among the plurality of electronic devices.

20 Claims, 5 Drawing Sheets

(56) References Cited

U.S. PATENT DOCUMENTS

| | | | | |
|---|---|---|---|---|
| 7,508,675 | B2* | 3/2009 | Just | H05K 7/1488 206/320 |
| 7,695,313 | B2* | 4/2010 | Karim | H02B 1/052 439/540.1 |
| 7,766,348 | B2* | 8/2010 | McFarland | A47F 5/11 108/52.1 |
| 7,845,894 | B2* | 12/2010 | Dickinson | B65D 19/20 414/258 |
| 8,061,521 | B1* | 11/2011 | Lowry | B65D 19/44 206/576 |
| 8,099,794 | B2* | 1/2012 | Carstens | G06F 1/163 2/16 |
| 8,467,176 | B2* | 6/2013 | Daley, III | G06F 1/1628 361/679.03 |
| 8,605,442 | B2* | 12/2013 | Wu | H05K 7/1489 211/26 |
| 8,867,199 | B2* | 10/2014 | Daley, III | G06F 1/163 361/679.03 |
| 9,563,235 | B2* | 2/2017 | Cao | G06F 1/163 |
| 2004/0011840 | A1* | 1/2004 | Lovett | A45C 13/30 224/584 |
| 2005/0265004 | A1* | 12/2005 | Coglitore | H05K 7/1488 361/724 |
| 2006/0061546 | A1* | 3/2006 | Jong | G06F 1/1656 345/156 |
| 2006/0272969 | A1* | 12/2006 | Hartstein | A45C 13/02 206/320 |
| 2006/0273757 | A1* | 12/2006 | Naguib | H02J 7/355 320/107 |
| 2007/0222410 | A1* | 9/2007 | Lee | H01L 31/0236 320/101 |
| 2009/0003820 | A1* | 1/2009 | Law | G03B 17/563 396/423 |
| 2009/0167237 | A1* | 7/2009 | Tsai | H01G 9/048 320/101 |
| 2012/0299528 | A1* | 11/2012 | Scarmozzino | A45C 5/02 320/101 |
| 2013/0108831 | A1* | 5/2013 | Wu | D04H 1/541 428/138 |

* cited by examiner

CONVERGED INFRASTRUCTURE STRAP

BACKGROUND

Many electronic devices are available in a form that can be mounted in an equipment bay, such as in a rack or an enclosure. A user of such electronic devices mounts the devices in a rack or in an enclosure, and couples the electronic devices together with cables. These electronic devices may have been purchased from different suppliers, or may have been purchased from a single supplier. In either case, the burden is on the user to determine which connector of which cable goes where, when coupling the electronic devices together. There may even be a debugging phase, in which a connector needs to be removed from where the connector had been plugged in and replaced in another location on the device or on another device. Thus, installation of electronic devices into an equipment bay is time-consuming, error-prone and frustrating for the user, even when the electronic devices are all shipped from a single supplier. Some suppliers solve these problems by shipping electronic devices preinstalled into a cabinet or preinstalled into a specifically sized rack, i.e., shipping a populated cabinet or rack complete with cables installed to the equipment. However, another problem arises as racks and cabinets may be available in specific sizes, such as a 24 RU (rack unit) or 48 RU rack or cabinet, each of which provides a 24 RU or 48 RU enclosure, respectively. If the number and size of the electronic devices consumes only one half of the available space for example, this is wasteful of shipping space and shipping costs. If the number and size of the electronic devices is such that the equipment doesn't quite fit in one size of enclosure, the devices could be installed and shipped in a larger enclosure, which is again wasteful of shipping space and shipping costs. A user who has rack space or cabinet space available for electronic devices and does not wish to purchase a populated cabinet or rack or free up floor space for such, is stuck with having to purchase the populated cabinet or having to install the cabling as above. None of the above solutions is optimal.

SUMMARY

Embodiments of a method, device and system are provided. In some embodiments, an equipment strap is provided. The equipment strap includes at least one strap, the at least one strap is configured to hold together a plurality of electronic devices as a bundle of the electronic devices. The equipment strap includes at least one panel attached to the at least one strap. The at least one panel includes at least one cable integrated therein. The at least one cable is configured to couple to the plurality of electronic devices, wherein the at least one cable provides an electrical interconnection among the plurality of electronic devices.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

An equipment strap system, featuring one or more straps attached or affixed to one or more panels, and cables integrated with the panels, is described herein. The strap (or straps) holds together a bundle of electronic devices. The cables couple together the electronic devices, prior to shipping or other transportation. The cabling includes data, power, and management cabling that provides aligned cabling from port to port. In some embodiments, the pre integrated cabling enables the cabling to be run between equipment at the time of manufacture or assembly. A bundle of electronic devices can thus be shipped, and installed upon receipt, with the cables coupled to the devices. It should be appreciated that the electronic devices include storage devices, network devices, switches, servers, power supplies, other computing devices, etc. In some embodiments, the electronic devices are any devices utilized for a converged infrastructure deployment. It should be appreciated that transportation of the electronic devices may include intergalactic transportation, international transportation, transportation across the country, transportation across the street, or transportation across a room. In addition, the mode of transportation may be any known mode of transportation or movement.

Figure 1:
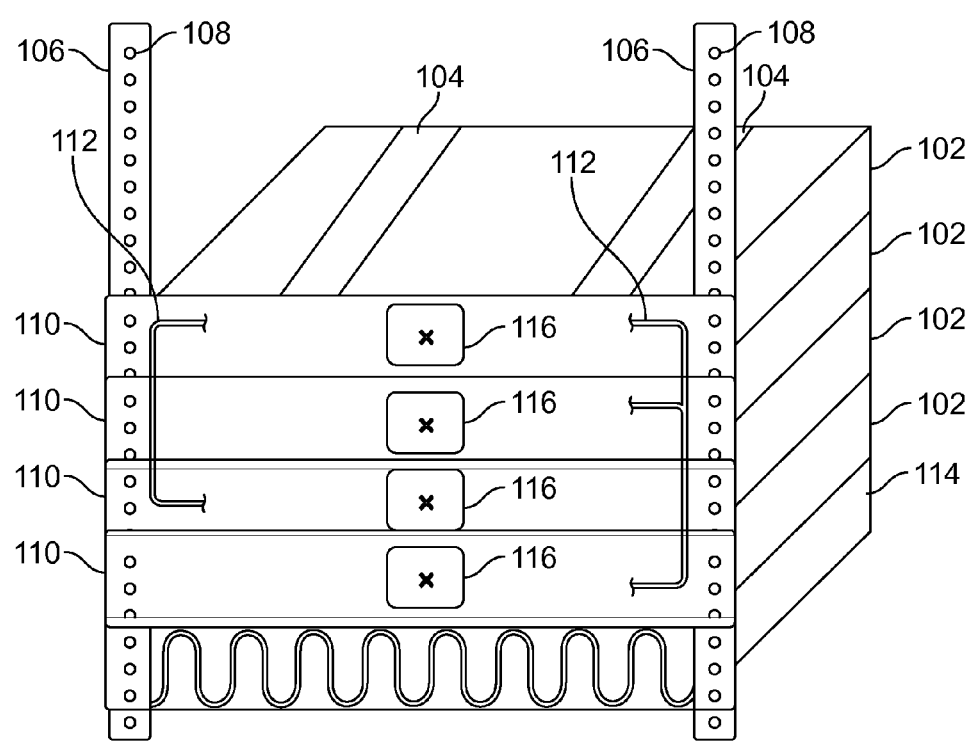
FIG. 1 is a perspective view of a bundle of electronic devices, held together by an equipment strap system, which includes one or more straps and one or more panels with integrated or embedded cables, in accordance with some embodiments.

FIG. 1 is a perspective view of a bundle of electronic devices 102, held together by an equipment strap system, which includes one or more straps 104 and one or more panels 110 with integrated or embedded cables 112, in accordance with some embodiments. The electronic devices 102 are shown installed into an equipment bay in a rack. Each electronic device 102 is attached to two rails 106 of the rack, such as by the fastening bolts or other fasteners through apertures 108 of the rails 106 and through apertures of the enclosure of the electronic device 102. The bundle of electronic devices 102 is installed to the rack as a bundle, i.e., as shipped and received, with the cables 112 providing interconnection among the electronic devices 102. That is, the cables 112, which are integrated into the panels 110, are coupled to the electronic devices 102 when the electronic devices 102 are bundled. The cables 112 remain coupled to the electronic devices 102 during shipping, and during and after installation into an equipment bay. The panels 110, with integrated cables 112, are positioned adjacent to the electronic devices 102, and the strap or straps 104 are secured around the bundle of electronic devices 102. In this example, each panel 110 is positioned at a front of a respective electronic device 102, although other arrangements could be devised. In a further embodiment, back panels are positioned at a back of each respective electronic device and the back of each electronic device may be affixed to a back rail through an aperture similar to rails 106 and apertures 108. Some embodiments employ one or more front panels and one or more back panels. In a still further embodiment, a panel could span two or more electronic devices 102, or could span the entire bundle of the electronic devices 102. The cables 112 can span multiple panels 110, so as to connect multiple electronic devices 102. For example, a cable 112 could be routed up and down across multiple panels, and side to side across one or more panels. The cable 112 could have several taps with associated connectors at interim points and endpoints. Both simpler and more complex arrangements of cables are envisioned. In some embodiments, panels 110 may include a region 116 where a logo may be displayed on the panel surface. The region 116 may be illuminated through power supplied through cables 112 in some embodiments.

In the embodiment shown in FIG. 1, the bundle of electronic devices 102 includes a shelf 114. Further embodiments could delete the shelf, add padding or spacers between two or more of the electronic devices 102, add a top shelf above the uppermost electronic device 102, or have various combinations of these. In one embodiment, the shelf 114 includes or is based on a hollowed 1RU enclosure that has been reinforced to handle several hundred pounds of equipment. The reinforcing could use a corrugated design, e.g., have a material such as plastic, fiber reinforced plastic, composite material or metal, formed in a corrugated arrangement in the interior of the shelf in some embodiments. In various embodiments, the shelf 114 has ventilation openings allowing for airflow through the shelf, passageways for front-to-back cable routing, passageways for straps to pass through, a mounting point for rails, or fittings for strap-related mechanical devices such as ratchets, or combinations thereof. The shelf 114 could be rail-mounted onto a rack allowing for easy installation and maintenance of equipment while in the installed location. In other words, the bundle would be mounted into the enclosure with the shelf 114 included. For maintenance or service, the entire bundle with the included shelf 114 could be removed, i.e., dismounted from, the enclosure.

Various embodiments of the equipment strap system support bundling of various numbers and various sizes of electronic devices together for transport and installation. Some embodiments can support varying form factors of the bundle, even when the form factor of the bundle differs from a cabinet enclosed solution. Aligning a strap 104 along a vertical plane, and adjusting the length and tightness of the strap, holds the equipment together. The strap 104 allows for panels 110 to be affixed to the equipment. The integrated cables 112 provide integrated wiring for data and power in some embodiments. Many different types of cables and styles of cables can be integrated into the panels 110, such as power cables, data cables, communication cables, fiber optic cables, wire cables, bus cables, network cables and so on. In some embodiments, handles are attached to the straps or to the shelf 114 and these handles provide for lifting and handling of the equipment or the equipment bundle. It should be appreciated that the handles may be made from the same material as the straps 104 in some embodiments. For example, the handles may be a nylon or synthetic polymer that is affixed to the strap by stitching, glue, rivets, etc. In some embodiments, the handles may be composed of a different material than the straps 104. These materials include plastic materials, woven or cloth materials, metal materials, etc. The handles may be flexible or rigid. It should be appreciated that the handles assist in lifting or moving the bundle of electronic devices during transportation and installation. For example, an end user or installer can lift the bundle of electronic devices and place the bundle into a rack or cabinet for efficient installation. Straps 104 that are adjustable in length accommodate multiple dimensions and ranges of numbers of electronic devices 102 that are bundled together.

Figure 2:
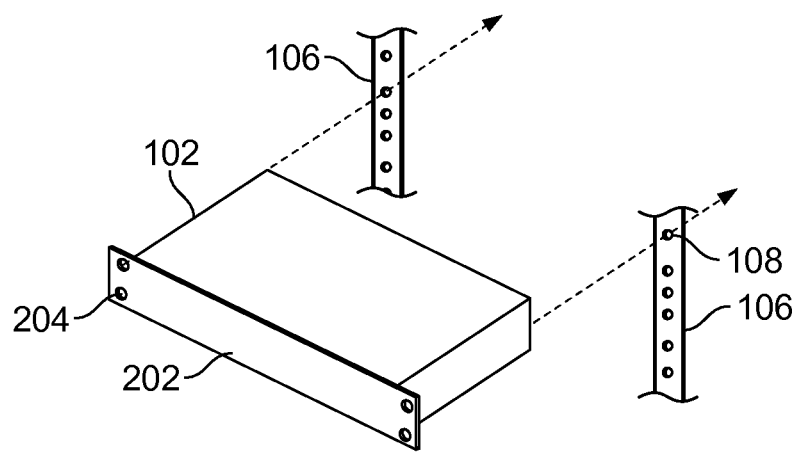
FIG. 2 is a perspective view of an electronic device being mounted to a rack in accordance with some embodiments.

FIG. 2 is a perspective view of an electronic device 102 mounted to a rack in accordance with one embodiment. Although the vertical rails 106 of the rack are shown, a rack may also include horizontal rails with channels for the equipment to slide in and out, vertical back rails, a base, and assorted additional fixtures in some embodiments. During installation, the electronic device 102 is oriented with a front face 202 of the electronic device 102 facing outward, and electronic device 102 is guided inward into the equipment bay. For example, the electronic device 102 could be guided by horizontal rails of the rack. Once the electronic device 102 is positioned so that the ends of the front face 202 are pressing against the rails 106 of the rack, bolts or other fasteners are inserted through the apertures 204 of the front face 202 and on through the apertures 108 of the rails of the rack, securing the electronic device 102 to the vertical rails 106 and in the rack. In a related manner, an electronic device 102 can be installed into the equipment bay of a cabinet. Other equipment bays in other types of equipment assemblies could also be used with the embodiments described herein.

Figure 3:
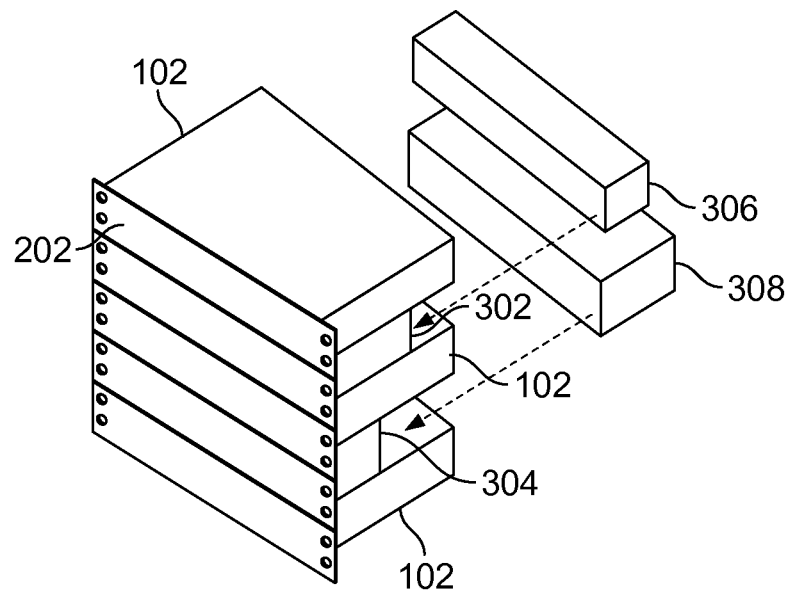
FIG. 3 is a perspective view of a stack of electronic devices being prepared for bundling, with spacers that align the backside of the bundle in accordance with some embodiments.

FIG. 3 is a perspective view of a stack configuration of electronic devices 102, 302, 304 being prepared for bundling, with spacers 306, 308 that align the backside of the bundle. The spacers 306, 308 could be made of foam, foam rubber, plastic, etc. In a case where all of the electronic devices 102 have a similar form factor, spacers may not be needed. In the example shown, some of the electronic devices 302, 304 have a shallower depth than other electronic devices 102. In this embodiment, an appropriate spacer 306, 308 is chosen and inserted into the stack of electronic devices so as to align the back side of the stack. Here, the front faces 202 of the electronic devices 102, 302, 304 in the stack are shown aligned. A shallower spacer 306 is inserted towards and mates with the back side of the electronic device 302. A deeper spacer 308 is inserted towards and pressed up against the back side of electronic device 304. The dimensions of the spacers 306, 308 are arranged or selected so that the depth of the spacer plus a depth of the electronic device to which the spacer corresponds is approximately equal to the depth of the deepest one of the electronic devices. That is, when one face of a spacer 306, 308 is pressed against a back of one of the electronic devices, another face of the spacer 306, 308 aligns with a back of another one of the electronic devices. In some embodiments, spacers can be inserted between the electronic devices. In some embodiments, spacers or bumpers are inserted alongside the electronic devices so as to match the width of the bundle to the width of the front faces 202 and to protect the ends of the front faces 202.

Figure 4:
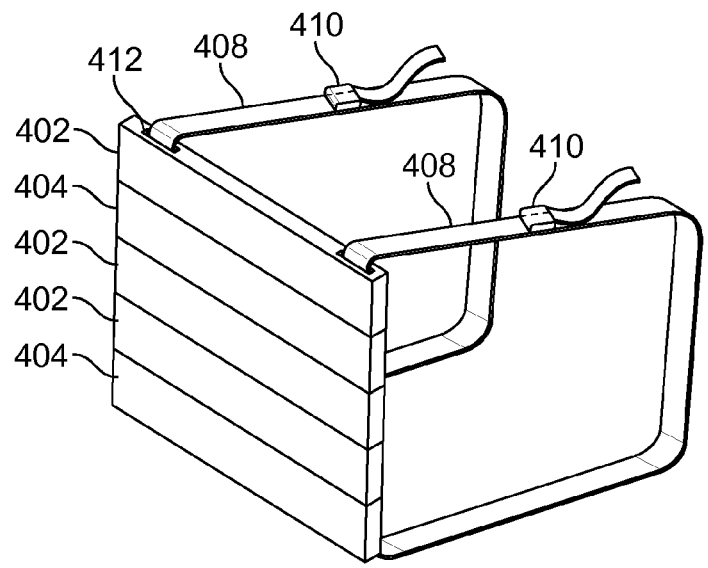
FIG. 4 is a perspective view of the equipment strap system of FIG. 1, without the electronic devices in accordance with some embodiments.

FIG. 4 is a perspective view of the equipment strap system of FIG. 1, without the electronic devices in accordance with some embodiments. Although shown with two straps 408, further embodiments could have a single strap or more than two straps. Each strap 408 threads through or traverses through an aperture 412 extending through each of the panels 402, 404, attaching the strap 408 to respective panels 402, 404. Various further types of mechanisms for attaching straps 408 to the panels 402, 404 are readily devised, and could include adhesives, rivets or other fasteners, molding the strap 408 into the panels 402, 404, and so on. Each strap 408 is adjustable in length. In the example shown, each strap 408 has a strap mechanism 410 that supports adjustment of the length and tension of the strap 408 and supports securing the strap 408 around the bundle. In this embodiment, the strap mechanism 410 includes a buckle and a cinch mechanism as found on some seatbelts. Two portions of the strap 408 are secured to each other by the buckle, and the strap "tail" is pulled in order to cinch the belt, tightening the strap 408 around the bundle. Other strap mechanisms in further embodiments include ratchets, hook and loop fasteners, crimpable fasteners, and thermal bonding fasteners. Straps could be made of nylon or nylon webbing, synthetic polymers, high-tensile strength plastic, a flexible mesh material, a combination of materials that are flexible and can secure the plurality of electronic devices, or other suitable material compatible with the environment in which the embodiments operate. In some embodiments, the material of the strap is a non-conducting material.

In the embodiment shown in FIG. 4, some of the panels could be made of various materials, such as high-tensile nylon, aluminum, plastic, etc. In some embodiments, the panels are thin, i.e., have a relatively small thickness, so as to mount relatively flush to rack mounting rails 106. Passages through the panels for the straps, or other mechanism for attaching the straps to the panels, should be arranged so that the straps do not interfere with the integrated cables. In a further embodiment, panels could have ventilation openings allowing passage of air flow for air circulation to the electronic devices.

Figure 5A:
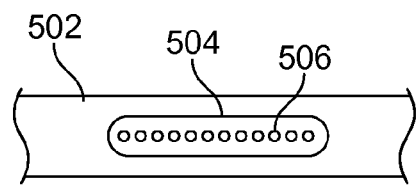
FIG. 5A is a cross-section view of one embodiment of a panel suitable for use in the equipment strap system of FIG. 1, featuring a cable that is molded into the panel in accordance with some embodiments.

FIG. 5A is a cross-section view of one embodiment of a panel 502 suitable for use in the equipment strap system of FIG. 1, featuring a cable 504 that is molded into the panel 502. It should be appreciated that the view of FIG. 5A cuts across the cable 504, which shows wires 506 in cross-section. In one embodiment, the cable 504 (or multiple cables) is placed into a mold and the molding material for the panel 502 is introduced into the mold, which then molds the cable 504 into the panel 502. Various types of cables could be used in this and other embodiments.

Figure 5B:
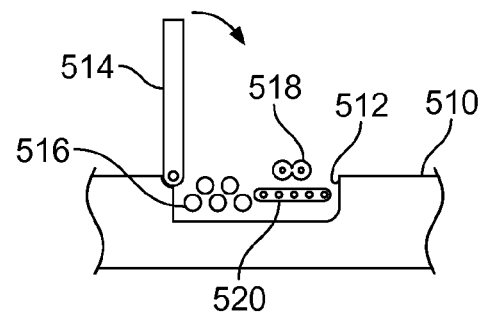
FIG. 5B is a cross-section view of one embodiment of a panel suitable for use in the equipment strap system of FIG. 1, featuring a cable run in accordance with some embodiments.

FIG. 5B is a cross-section view of one embodiment of a panel 510 suitable for use in the equipment strap system of FIG. 1, featuring a cable run 512. In one version of a cable run 512, a channel or groove is molded into or otherwise formed into the panel 510. Cables 516, 518, 520 are laid into the cable run 512. Cables could include fiber-optic cable 516, ribbon cables 520, power cables 518 and other types of cables. A lid 514, which could be a hatch, a cap, or a cover etc., is then closed down upon the cables, trapping or otherwise retaining the cables in the cable run 512.

Figure 5C:
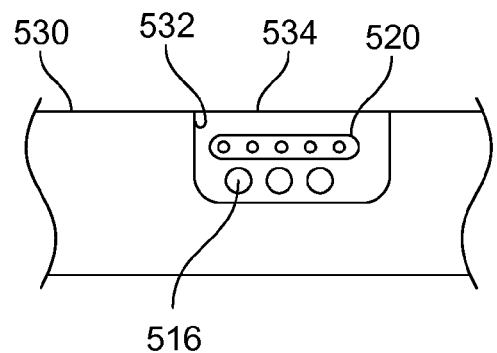
FIG. 5C is a cross-section view of one embodiment of a panel suitable for use in the equipment strap system of FIG. 1, featuring a cable that is bonded to the panel in accordance with some embodiments.

FIG. 5C is a cross-section view of one embodiment of a panel 530 suitable for use in the equipment strap system of FIG. 1, featuring a cable 520 that is bonded to the panel 530. A groove or channel 532 is formed into the panel 530, for example by molding, or removing material. Cables, such as a ribbon cable 520 and fiber-optic cables 516 or other cables, are inserted into the channel 532, i.e., inserted into the panel 530. A bonding material 534, such as an adhesive, silicone, plastic, etc. is introduced into the channel 532. Such introduction could be before or after inserting the cables into the channel 532. The bonding material 534 is then cured. In further embodiments, the cable could be adhered to a surface of the panel 530, or fastened to the surface of the panel 530 or to a channel 532 of the panel 530 by fasteners.

Figure 5D:
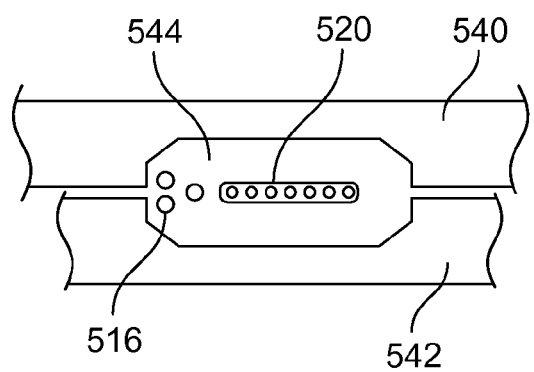
FIG. 5D is a cross-section view of one embodiment of a panel suitable for use in the equipment strap system of FIG. 1, featuring a cable that is sandwiched inside the panel in accordance with some embodiments.

FIG. 5D is a cross-section view of one embodiment of a panel 540, 542 suitable for use in the equipment strap system of FIG. 1, featuring a cable 520 that is sandwiched between surfaces of the panels 540 and 542. In this embodiment, a first panel member 540 and a second panel member 542 are arranged to fit together leaving a cavity 544 therebetween. One or more cables, such as the fiber-optic cables 516 and a ribbon cable 520, are placed into the cavity 544. The first panel member 540 and the second panel member 542 are closed around the cables 516, 520, sandwiching the cables 516, 520 between opposing surfaces of panels 540 and 542. Various mechanisms for securing the first panel member 540 to the second panel member 542, such as the use of pins or tabs and pockets or slots, snaps, barbs, adhesives, molding, and so on are readily devised. The first panel member 540 and the second panel member 542 could be formed integrally with a hinge, or as two separate members. An adhesive or a filling compound could be applied to the cavity 544.

Figure 6:
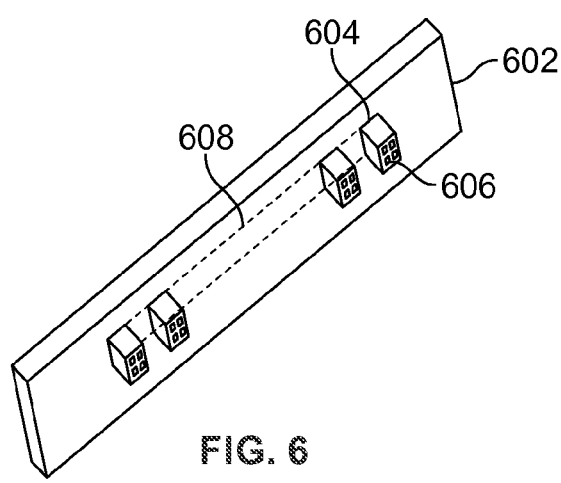
FIG. 6 is a perspective view of a backside of a panel suitable for use in the equipment strap system of FIG. 1, showing connectors coupled to an embedded cable in accordance with some embodiments.

FIG. 6 is a perspective view of a backside of a panel 602 suitable for use in the equipment strap system of FIG. 1, showing connectors 604 coupled to an embedded cable 608 (shown in dashed lines). Various types of connectors 604 can be used, as appropriate to the type of cable and the type of connection to the electronic device 102. In this example, a connector 604 has a socket 606 for receiving pins of a mating connector. The connectors 604 are selected and arranged on the back side of the panel 602 so as to mate with the corresponding electronic device 102. When employed with the equipment strap system, the panel 602 can be pressed into place onto a surface of the electronic device 102, mating the connectors 604 of the panel 602 with the corresponding connectors of the electronic device 102. Some panels have multiple connectors of a particular type, other panels have mixed types of connectors, and some panels have both. It should be appreciated that in some embodiments, connector 604 may be an opening in the surface of the panel enabling a cable routed through the panel 602 to be connected to electronic device 102. In some embodiments, there are connectors for electrically coupling one panel to another panel, i.e., coupling a cable of one panel, or a portion of such a cable, to a cable or a portion of a cable of a neighboring panel. In some embodiments, there are physical couplings for mechanically mating one panel to another. In some embodiments, a cable can be routed across or through multiple panels. With these various arrangements, integrated cables in the panels and connectors from one panel to another panel can route signals or power among multiple electronic devices 102. Particularly, two or more electronic devices in a bundle, whether neighboring or spaced further apart, can be interconnected via the various connectors and integrated cables. The integrated cables thus provide interconnection among the electronic devices. In some embodiments of a bundle, the integrated cables provide a majority of the functional interconnection for interoperability of the electronic devices. That is, the electronic devices can be operated as a group using the connections provided by the integrated cables. In some embodiments of a bundle, it is even a goal to provide the bundle with all of the functional interconnection for interoperability, so that the bundle of electronic devices can be installed in an equipment bay, connected to a network or other equipment, then powered up and used immediately, or soon after local configuration of data, without further need of adding any interconnections among the electronic devices beyond that provided by the equipment strap system.

Figure 7:
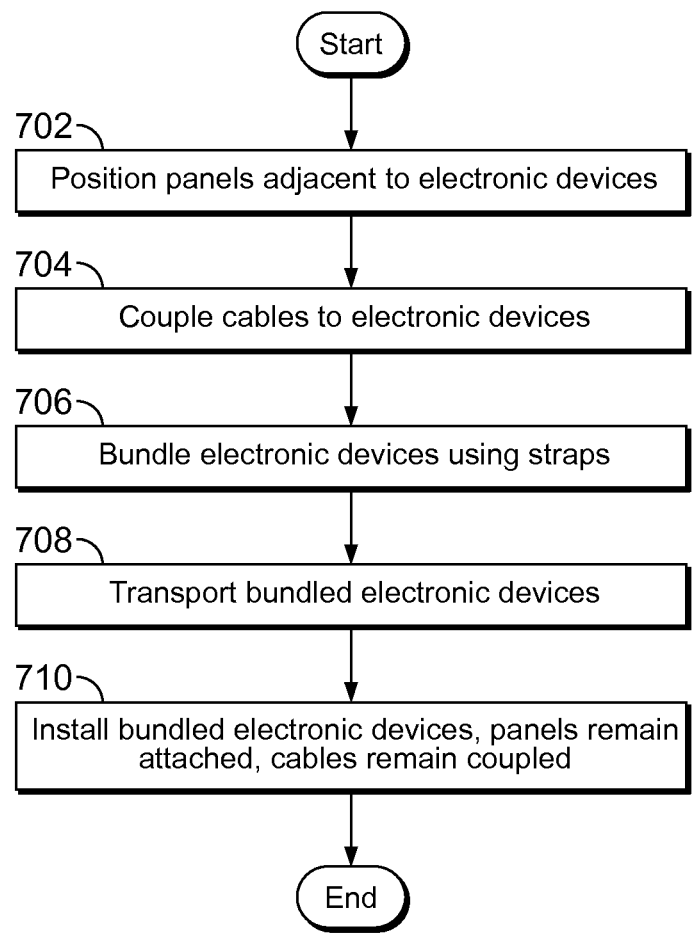
FIG. 7 is a flow diagram of a method of strapping electronic devices in accordance with some embodiments.

FIG. 7 is a flow diagram of a method of strapping electronic devices. Examples of how to apply the method using embodiments of the equipment strap system are given below. The method can be practiced at a partner manufacturing facility, where electronic devices from two or more partners are combined, and prepared for shipping to a customer. Configuration of each electronic device could occur at a respective manufacturing facility, or at the partner manufacturing facility. Equipment could be stacked on a shelf or stacked on a shipping pallet. Front and back panels could be added to straps or vice versa, and cable dressing through panels could be performed. Additional shipping materials could be added to provide rigidity and protection to the equipment. This could include foam or rubber bumpers installed between straps and equipment in some embodiments. Strips acting like the rail mount could be used to hold the equipment together utilizing the "ears" or ends of mounting kits of each piece of equipment. These strips could then be used to attach the converged infrastructure, i.e., the combined electronic devices, to the cabinet or rack that houses the equipment. The equipment would then be ready for shipment.

From a start point, in an action 702, the panels are positioned adjacent to electronic devices. For example, one or more of the panels of the equipment strap could be positioned adjacent to one or more of the electronic devices. The panel could be positioned adjacent to a front of electronic device. Straps could be attached to the panels before or after action 702. In an action 704, cables are coupled to the electronic devices. For example, the cables that are integrated with the panels are coupled to the electronic devices, using connectors coupled to the cables as described above in some embodiments. In one embodiment, this can be accomplished by coupling panels together electrically, physically, or physically and electrically, then pressing the panels onto the electronic devices, so that connectors on backsides of panels couple to the electronic devices. In an action 706, the electronic devices are bundled using straps. For example, the straps that are attached to the panels are secured around a stack of electronic devices. Spacers, if needed could be inserted before the strapping action. In some embodiments, one or more straps may be looped around the outside of a bundle of electronic equipment and the one or more straps are tightened around the outside of the bundle so as to securely hold the bundle of electronic devices together as a unit. It should be appreciated that any of the mechanisms noted above with regard to FIG. 4 may be utilized to strap the electronic devices together. It should be appreciated that the straps may be coupled to the panels. For example, the strap or straps may traverse through openings or apertures of the panels as illustrated in FIG. 4 in some embodiments. Alternatively, the straps may be affixed to a surface of the panel through fasteners, glue, etc.

The bundled electronic devices are transported, in an action 708 as a stack of interconnected electronic devices. For example, the bundle is shipped with the strap or straps securing the electronic devices, the panels attached to the electronic devices, and the cables, as integrated into the panels, coupling the electronic devices. The bundled electronic devices are installed, in an action 710. The installation panels remain attached to the electronic devices, and the cables remain coupled to the electronic devices, before, during and after the installation. In some embodiments the panels are affixed to a rail or rack of a cabinet or rack unit that the electronic devices are installed into. The panels may be secured to the rail or rack through a screw, fastener, tie or some other suitable fastening mechanism. In some embodiments the bundle of electronic devices rests on the shelf included with the bundle and avoids the need to be secured to a rail or rack system within a cabinet.

Although the method operations were described in a specific order, it should be understood that other operations may be performed in between described operations, described operations may be adjusted so that they occur at slightly different times or the described operations may be performed in a differing order in embodiments of the method.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An equipment strap, comprising:
   at least one strap, the at least one strap coupled to a plurality of electronic devices, wherein the at least one strap holds together the plurality of electronic devices as a bundle of the electronic devices;
   at least one panel attached to the at least one strap, the at least one panel coupled to at least one of the plurality of electronic devices, wherein the at least one panel has integrated therein at least one cable that is embedded within an interior of the at least one panel and extends across provides interconnects among the plurality of electronic devices; and
   at least one rail, wherein the at least one rail couples the plurality of electronic devices to a rack.

2. The equipment strap of claim 1, wherein the at least one cable is configured to couple to the plurality of electronic devices such that the bundle of the electronic devices are transportable with the at least one cable coupled to the plurality of electronic devices, wherein the at least one cable provides an electrical interconnection among the plurality of electronic devices when transported.

3. The equipment strap of claim 2, wherein the at least one cable provides a functional interconnection for interoperability of the plurality of electronic devices.

4. The equipment strap of claim 1, wherein the at least one strap has a strap mechanism that includes one from a set consisting of: a ratchet, a cinch, a buckle, a hook and loop fastener, a crimpable fastener, and a thermal bonding fastener.

5. The equipment strap of claim 1, wherein the bundle of the electronic devices is configured to be installed in an equipment bay of the rack with the at least one strap intact and with the at least one panel attached to at least one of the plurality of electronic devices, and wherein the at least one strap includes a handle affixed to the at least one strap.

6. The equipment strap of claim 1, further comprising:
   a plurality of spacers of varied depths, each one of the plurality of spacers configured to insert behind one of the plurality of electronic devices so as to align a backside of the bundle of the electronic devices when fronts of the plurality of electronic devices are aligned at a front of the bundle of the electronic devices.

7. The equipment strap of claim 1, further comprising:
   a shelf to which the at least one strap is attached, the shelf configured to support the plurality of electronic devices as part of the bundle of the electronic devices, and the shelf configured to install into an equipment bay of the rack along with the bundle of the electronic devices.

8. The equipment strap of claim 1, wherein the at least one strap traverses through an aperture extending through the at least one panel.

9. A strap system, comprising:
   one or more straps, wherein the one or more straps are configured to bundle a plurality of electronic devices arranged in a stack configuration;
   at least one rail, wherein the at least one rail couples the plurality of electronic devices to a rack;
   one or more panels attached to the one or more straps, each panel of the one or more panels configured to fit to one or more of the plurality of electronic devices wherein the one or more panels have integrated therein one or more cables that are embedded within an interior of the one or more panels and extends across and provides interconnects among the plurality of the electronic devices.

10. The strap system of claim 9, further comprising:
    a spacer insertable behind a first one of the plurality of electronic devices in the stack configuration such that a depth of the spacer and a depth of the first one of the plurality of electronic devices is equivalent to a depth of a second one of the electronic devices.

11. The strap system of claim 9, further comprising;
    a shelf attached to the one or more straps, the shelf configured to support the plurality of electronic devices as part of the stack configuration, and the shelf configured to be rail-mounted to the at least one rail.

12. The strap system of claim 9, further comprising:
    two or more connectors coupled to the one or more cables, each of the two or more connectors configured to couple to a respective one of two or more of the plurality of electronic devices, such that the two or more connectors and the one or more cables interconnect the two or more of the plurality of electronic devices.

13. The strap system of claim 12, wherein the one or more cables integrated into the one or more panels includes one from a set consisting of:
    the one or more panels including a cable run, with at least a portion of the one or more cables enclosed in the cable run;
    the one or more cables fastened to the one or more panels;
    at least a portion of the one or more cables embedded in the one or more panels;
    at least a portion of the one or more cables molded into the one or more panels;
    the one or more cables bonded to the one or more panels; and
    at least a portion of the one or more cables sandwiched inside the one or more panels.

14. The strap system of claim 9, wherein the one or more panels has an opening configured to couple at least one of the one or more cables extending through the one or more panels to one of the plurality of electronic devices.

15. The strap system of claim 9, wherein the one or more panels includes at least one front panel and at least one back panel.

16. A method of strapping a plurality of electronic devices, comprising:
    bundling, with one or more straps, the plurality of electronic devices, wherein the bundling comprises:
        attaching one or more straps to one or more panels coupled to at least one of the plurality of electronic devices wherein the one or more panels have integrated therein one or more cables that are embedded within an interior of the one or more panels and extends provides interconnects among and connects the plurality of electronic devices, and
    at least one rail, wherein the at least one rail couples the plurality of electronic devices to a rack.

17. The method of claim 16, further comprising:
    aligning fronts of the plurality of electronic devices; and
    inserting a spacer so that a first face of the spacer is proximate to a back of a first one of the plurality of electronic devices, wherein a second face of the spacer aligns with a back of a second one of the plurality of electronic devices.

18. The method of claim 16, further comprising:
positioning the plurality of electronic devices atop a shelf, wherein the shelf is attached to the one or more straps, and wherein the bundled plurality of electronic devices is transportable with the one or more panels attached to the plurality of electronic devices.

19. The method of claim 16, further comprising:
coupling the one or more cables to the plurality of electronic devices;
wherein the one or more panels includes two panels with at least one of the one or more cables spanning the two panels; and
moving the plurality of electronic devices through assistance of a handle affixed to the one or more straps.

20. The method of claim 16, wherein the one or more straps traverse through an aperture extending through the one or more panels.

\* \* \* \* \*